United States Patent [19]
Andrys et al.

[11] Patent Number: 6,057,714
[45] Date of Patent: May 2, 2000

[54] DOUBLE BALANCE DIFFERENTIAL ACTIVE RING MIXER WITH CURRENT SHARED ACTIVE INPUT BALUN

[75] Inventors: Paul R. Andrys, Swisher; Philip H. Thompson, Mt. Vernon, both of Iowa

[73] Assignee: Conexant Systems, Inc., Newport Beach, Calif.

[21] Appl. No.: 09/087,315

[22] Filed: May 29, 1998

[51] Int. Cl.[7] ...................................... H04B 1/28
[52] U.S. Cl. ........................ 327/105; 327/355; 327/357; 327/113; 327/116; 327/362; 327/233; 455/333; 455/326
[58] Field of Search ..................... 327/355, 362, 327/359, 113, 116, 357, 233; 455/326, 333

[56] References Cited

U.S. PATENT DOCUMENTS

| | | | |
|---|---|---|---|
| 5,060,298 | 10/1991 | Waugh et al. | 455/326 |
| 5,826,182 | 10/1998 | Gilbert | 327/359 |

OTHER PUBLICATIONS

"The Micromizer: A Highly Linear Variant of the Gilbert Mixer Using a Bisymmetric Class–AB Input Stage," Barrie Gilbert, IEEE Journal of Solid–State Circuits, Sep. 1997, vol. 32, No. 09.

*Primary Examiner*—Dinh T. Le

[57] ABSTRACT

A frequency conversion or synthesis circuit including a double balance differential active ring mixer with a current shared active radio frequency (RF) input balun, suitable for use in an RF receiver. The circuit is configured to be coupled to a bias circuit for providing a relatively constant current and a buffer circuit for receiving a signal from a local oscillator (LO) source and generating differential LO signals. The circuit includes an input node for receiving an electronic input signal; a balun circuit including a common gate amplifier having a source, a drain, and a gate, the source being coupled to the input node, the gate being DC coupled to the bias circuit and AC coupled, directly or indirectly, to ground, and to the drain comprising a first differential output; a common source amplifier having a source, a drain, and a gate, the source being DC coupled to ground, the gate being coupled to the bias circuit and the input node, and the drain comprising a second differential output; and a mixer, coupled to the first and second differential outputs and the differential LO signals, for generating differential intermediate frequency outputs. The balun circuit may also be used with other loads.

25 Claims, 3 Drawing Sheets

DOUBLE BALANCE DIFFERENTIAL ACTIVE RING MIXER WITH CURRENT SHARED ACTIVE INPUT BALUN

TECHNICAL FIELD

This invention relates to electronic systems, and more particularly to a balanced/unbalanced transformer and mixer suitable for use in a frequency converter or frequency synthesis system.

BACKGROUND

A number of electronic systems require frequency conversion or frequency synthesis. For example, radio frequency (RF) "downconverters" receive a transmitted RF modulated carrier waveform at a high frequency (e.g., 1.9 GHz) and frequency convert the modulated signal to an unmodulated signal at a lower frequency (e.g., 250 MHz). RF receivers are increasingly being used in a number of popular "wireless" handheld, low power devices, such as Personal Communications Service (PCS) and Personal Handiphone Service (PHS) cellular telephones. Most of the functions of a complete RF receiver can now be fabricated in an integrated circuit (°C.) or IC chip set. In implementing an RF integrated circuit (RFIC) receiver for low power use, it was found by the inventors that there was a need for additional gain in such a receiver without expending additional DC current.

Another problem of implementing an RFIC was found to be in implementing a balun function. A balun (short for BALanced to Unbalanced) is a transformer connected between a balanced source or load (signal line) and an unbalanced source or load (signal line). A balanced line has two signal line conductors, with equal currents in opposite directions. The unbalanced signal line has just one conductor; the current in it returns via a common ground or earth path. Typically, an RF balun function is implemented as an off-chip transformer or as a quarter wave hybrid (lumped or microstrip) integrated into an RFIC. These RF baluns are commonly used with doubly balanced mixers such as a Gilbert cell and a passive FET ring. Although such baluns consume no current, these passive structures are lossy, narrowband, and consume precious printed circuit board or RFIC area A differential amplifier is another alternative solution, but at RF frequencies, the noise figure is prohibitive. As another alternative, in many applications, a balun is not used, and a passive FET ring or a Gilbert cell mixer is driven single-ended at RF, which degrades the balance and performance of the mixer. One attempt to address these issues with an active circuit is disclosed in Gilbert, "The MICROMIXER: A Highly Linear Variant of the Gilbert Mixer Using a Bisymmetric Class-AB Input Stage", IEEE Journal of Solid-State Circuits, Vol. 32, No. 9 (Sept. 1997).

The inventors have determined that there is a need for a circuit that can add gain in an RFIC frequency converter without using additional DC current, and a circuit for implementing an on-chip balun function without the drawbacks of prior circuits. The present invention meets both needs with a single circuit.

SUMMARY

The invention is a frequency converter and/or synthesizer circuit that includes a double balance differential active ring mixer with a current shared active radio frequency (RF) input balun, suitable for use in an RF receiver.

The inventive circuit is configured to be coupled to a bias circuit for providing a relatively constant current and a buffer circuit for receiving a signal from a local oscillator (LO) source and generating differential LO signals. In one aspect, the inventive circuit includes an input node for receiving an electronic input signal; a balun circuit including a common gate amplifier having a source, a drain, and a gate, the source being coupled to the input node, the gate being DC coupled to the bias circuit and AC coupled, directly or indirectly, to ground, and the drain comprising a first differential output; a common source amplifier having a source, a drain, and a gate, the source being DC coupled to ground, the gate being coupled to the bias circuit and the input node, and the drain comprising a second differential output; and a mixer, coupled to the first and second differential outputs and the differential LO signals, for generating differential intermediate frequency outputs. The balun circuit may also be used with other loads.

Advantages of the preferred embodiment of the invention include:

The active balun circuit provides 180 degree apart differential current inputs with gain to a doubly balanced active FET ring mixer.

The active balun circuit shares DC current between the balun and the active FET ring mixer.

The active balun circuit provides pre-mixer gain. Adding gain ahead of the mixer requires no additional DC current and partially masks the mixer noise figure, resulting in a higher gain, lower noise downconverter compared to passive lossy balun/mixer combinations.

The balun circuit of the present invention may be implemented within an integrated circuit without consuming significant die area. Since the balun is integrated, no off-chip balun transformer is required. Further, the impedance at the IC RF input die pad is low, reducing package parasitic effects on the input match.

A common-gate/common-source balun topology is coupled with a common-gate mixer topology. This configuration possesses a broadband RF input impedance and frequency response. Thus, it is more tolerant of temperature and RFIC process variations and provides a constant broadband termination impedance for an external image reject band pass filter. Exploiting these broadband characteristics further may have use in wideband and zero-IF/direct conversion receiver applications.

The details of one or more embodiments of the invention are set forth in the accompanying drawings and the description below. Other features, objects, and advantages of the invention will be apparent from the description and drawings, and from the claims.

DESCRIPTION OF DRAWING

Like reference numbers and designations in the various drawings indicate like elements.

DETAILED DESCRIPTION

The invention will be described in the context of an RF transceiver implemented as an FET-based integrated circuit. The transceiver RFIC may be used to perform amplification, RF to intermediate frequency (IF) frequency conversion, and gain control functions in a wireless handset or basestation application. However, it should be understood that the invention may be implemented in alternative integrated circuit fabrication technologies, including GaAs MESFET, SiGe or GaAs HBT's, bipolar, and MOS devices. Further, the invention may be used in both frequency conversion and frequency synthesis applications.

In a receive mode for a preferred embodiment, an incoming signal at (e.g., at about 1.9 GHz) from an antenna transmit/receive switch enters a low noise amplifier (LNA) within the RFIC. The amplified output of the LNA may be applied to a multi-step attenuator to optimize linearity and sensitivity and Receiving Signal Strength Indication (RSSI) dynamic range. The signal is then routed out of the RFIC to an external image reject band pass filter (BPF). The signal comes back into the RFIC and enters a downconverter block where it is converted to an intermediate frequency (e.g., about 250 MHz) differential signal by application of local oscillator (LO) frequency (e.g., about 1650 MHz). The IF differential signal is amplified and combined and routed through an IF transmit/receive switch that allows the BPF channel filter to be shared in both transmit and receive modes. The IF switch may include a second attenuator that is also used to optimize the RSSI range of the system.

Figure 1:
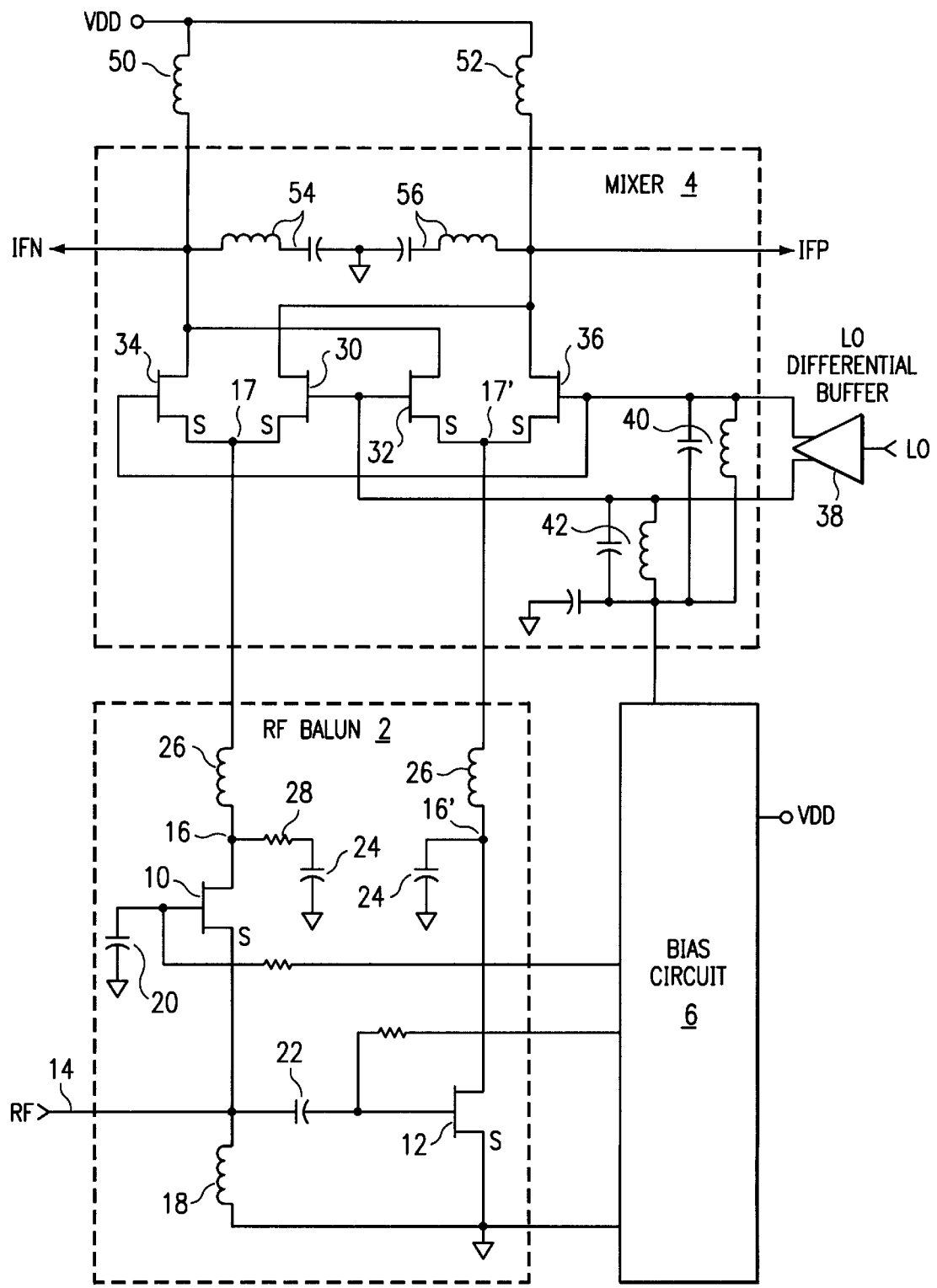
FIG. 1 is a schematic diagram of an RF downconverter in accordance with the invention.

FIG. 1 is a schematic diagram of an RF downconverter in accordance with the invention. The downconverter includes two stages: an active RF balun (180° apart RF power splitter/amplifier) 2, and an active double-balanced mixer 4.

The active RF balun 2 includes a common gate (CG) amplifier 10 and a common source amplifier 12 sharing a common input 14. In the illustrated embodiment, the input signal is an RF signal. For purposes of the invention, the term "common gate amplifier" includes a comparable bipolar technology implementation as a common base amplifier, and the term "common source amplifier" includes a comparable bipolar technology implementation as a common emitter amplifier.

The CG amplifier 10 sets the input impedance of the circuit at roughly 1/Gm, where Gm is the transconductance of the amplifier. The voltage gains for the output 16 of the CG amplifier 10 and the output 16' of the CS amplifier 12 are GmRL and -GmRL, respectively, where RL is the composite load impedance consisting of the impedance of the amplifier output and the impedance of the mixer 4 input. The drain bias of the RF balun 2 is provided through the mixer input since the balun is current shared with the mixer.

More particularly, in implementing a preferred embodiment of the RF balun 2, enhancement mode FET (EFET) devices were chosen for the CG amplifier 10 and the CS amplifier 12 to maximize gain (highest Gm) and to allow gate bias control with a single positive power supply. The CS amplifier 12 has its source tied directly to ground and the CG amplifier 10 has its source connected to ground directly or indirectly. In the illustrated embodiment, the source of the CG amplifier is connected to ground through an integrated inductor 18 (e.g., a spiral inductor), which acts as an RF bias choke. A bias circuit (e.g. a current mirror) 6 is used to provide the gate bias for the CG amplifier 10 and the CS amplifier 12. The current mirror 6 maintains a relatively constant current over process and temperature.

The CG amplifier 10 gate bias preferably is offset slightly from the CS amplifier 12 gate bias to account for the current-resistance (IR) drop in the integrated inductor 18 used to bias the CG amplifier 10 source. Integrated capacitors 20, 22 (e.g., metal-insulator-metal capacitors) are used to respectively bypass the CG amplifier 10 gate and to decouple the CS amplifier 12 gate from the CG amplifier 10 source.

In the preferred embodiment, a "shunt" integrated capacitor 24 and a "series" integrated inductor 26 are placed between each balun drain 16, 16' and the corresponding mixer 4 inputs 17, 17' to provide an impedance transformation in order to maximize power gain. To achieve good output amplitude and phase balance, a resistor 28 preferably is placed in series with the shunt capacitor 22 on the CG amplifier 10 side of the RF balun 2 to compensate for the slightly higher output impedance and voltage gain of the CG amplifier 10.

The active mixer 4 preferably uses four large depletion mode FET (DFET) devices 30, 32, 34, 36 connected as shown in a commutating ring to provide balance on all ports. As mentioned above, the mixer 4 and RF balun 2 are current shared. The RF balun 2 acts as an AC voltage-to-current converter and also sets the DC current for the mixer 4. The mixer's DC gate bias (typically about 0.3V) is derived from the current mirror 6, allowing bias tracking over temperature and process variations. This mixer gate bias combined with the mixer DFET current density sets the mixer input/balun output signal (drain) voltage (typically about 1V) at nodes 16, 16'. The differential mixer IF outputs (DFET drains), IFN (negative) and IFP (positive), preferably are biased at the supply voltage, $V_{DD}$ (typically about 3V) using corresponding external inductors 50, 52, since integrated inductors would not be of practical size or Q using present technology.

The mixer 4 looks like a common gate amplifier at each RF port 17, 17' which results in a relatively low impedance (1/Gm). The low RF port impedance keeps the RF voltage to a minimum which in turn maximizes linearity. The gates of the DFET devices 30–32 and 34–36 serve as differential local oscillator (LO) ports for a differential LO output signal from an integrated differential amplifier LO buffer 38. The function of the LO buffer 38 is to provide a relatively constant differential LO signal to the downconverter over a wide range of LO input power. The LO ports for nodes 30–32 and 34–36 have corresponding parallel resonant LC tank circuits 40, 42 that provide a high in-band (e.g., around 1.65 GHz) impedance and a low out-of-band (i.e., for all other frequencies away from the in-band frequency) impedance to the outputs of the LO buffer 38. Noise from the LO buffer 38 at IF and LO±IF frequencies can potentially be converted and emerge at the IF ports, IFN, IFP, degrading the downconverter noise figure. The LC tank circuits 40, 42 attenuate this noise before it is converted.

The differential LO waveforms from the LO buffer 38 preferably are sine waves delivered from a relatively low output impedance buffer (e.g., ≦100 ohms). Peak amplitudes would typically be about 0.7V. The LO sine waves in combination with the DC bias of the mixer gates and sources result in $V_{GS}$ excursions from about one-half $I_{DSS}$, where the DFETs have gain, to well below pinchoff. Unlike a passive FET mixer, the FETs operate in the saturation region rather than the ohmic region, and thus it is not desirable for $V_{GS}$ to be positive.

The impedance at each IF output IFN, IFP is primarily set by the Q of a corresponding off-chip bias inductor 50, 52 and the output impedance of the mixer DFETs 30–36. A high impedance is desirable for maximu=voltage gain, but can make the mixer performance susceptible to parasitic capacitance and resistive losses and also results in a narrowing of the IF bandwidth, since the mixer bias inductors and parasitic capacitances at these nodes create a parallel resonant circuit. Also included on each IF output IFN, IFP is a corresponding integrated 2*LO trap 54, 56 each including an integrated inductor in series with an integrated capacitor to ground. These traps 54,56 are desirable since the mixer 4 can create a very large 2*LO common-mode product without the traps, which has been shown in laboratory experiments to degrade the mixer gain and noise figure if not suppressed.

Figure 2:
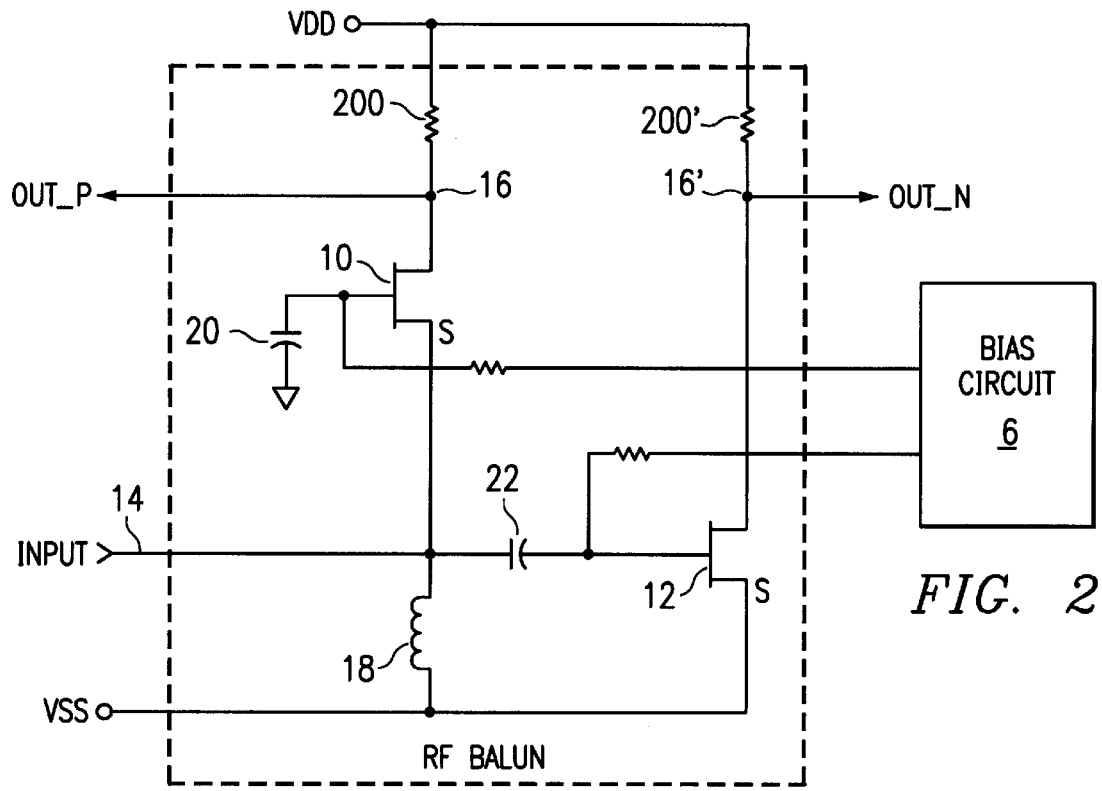
FIG. 2 is a schematic diagram of an active RF/IF input balun with resistive loading, in accordance with the invention.
Figure 3:
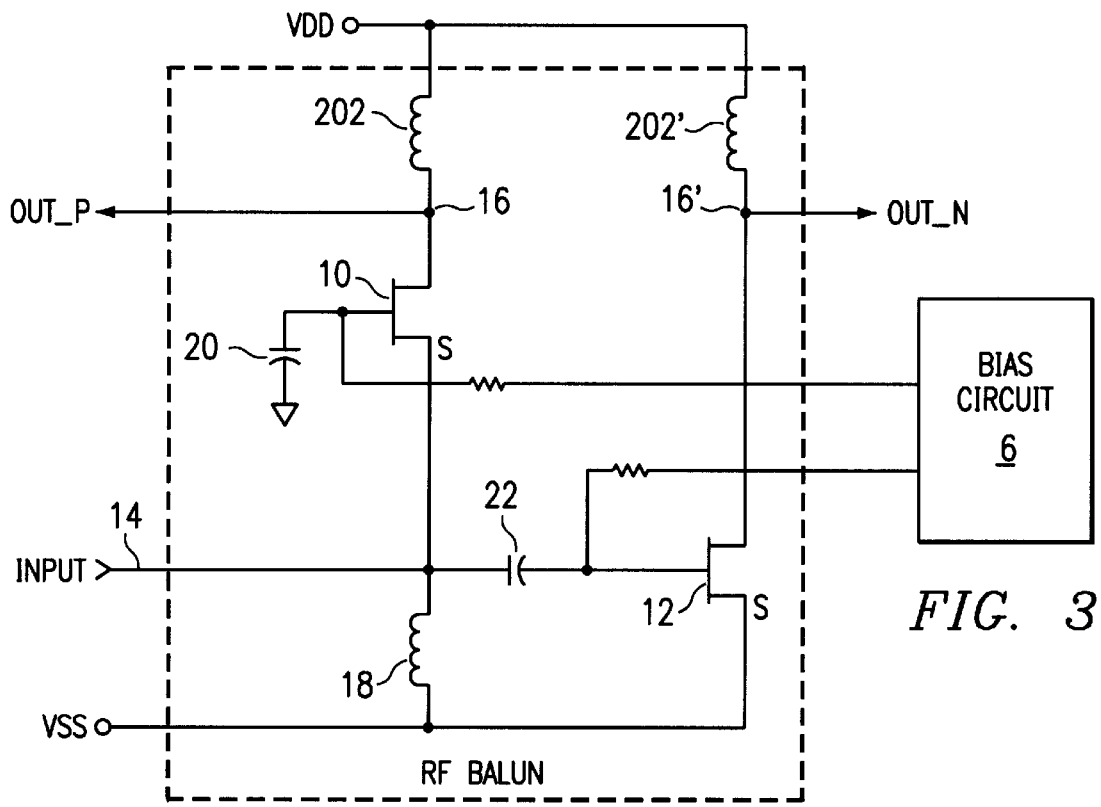
FIG. 3 is a schematic diagram of an active RF/IF input balun with inductive loading, in accordance with the invention.
Figure 4:
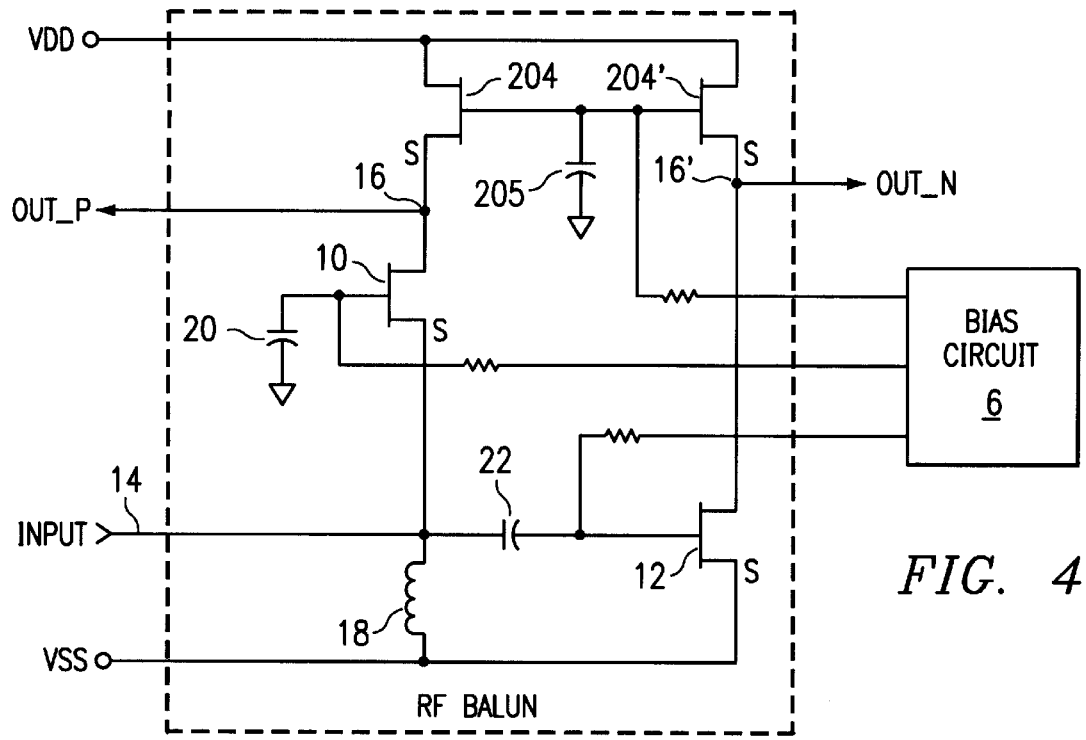
FIG. 4 is a schematic diagram of an active RF/IF input balun with active loading, in accordance with the invention.
Figure 5:
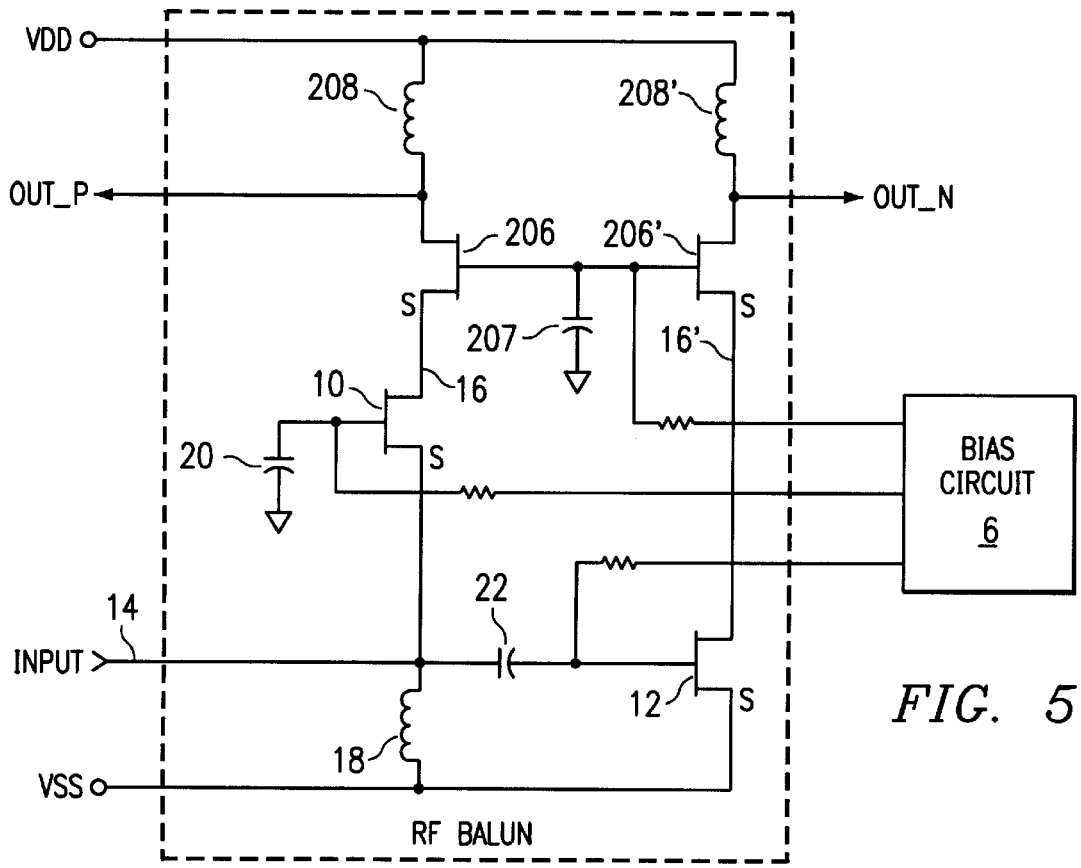
FIG. 5 is a schematic diagram of an active RF/IF input balun coupled to a differential inductively loaded cascode amplifier, in accordance with the invention.

A number of embodiments of the present invention have been described. Nevertheless, it will be understood that various modifications may be made without departing from the spirit and scope of the invention. For example, the balun circuit of the invention may be used as a standalone circuit, with loads other then a mixer. FIG. 2 is a schematic diagram of an active RF/IF input balun with resistive loading (resistors 200, 200'); FIG. 3 is a schematic diagram of an active RF/IF input balun with inductive loading (inductors 202, 202'; and FIG. 4 is a schematic diagram of an active RF/IF input balun with active loading (transistors 204, 204', biased by capacitor 205). All three configurations have outputs OUT_P (positive) 1S and OUT_N (negative). The active load in FIG. 4 may be applicable in low frequency applications where a large amount of voltage gain is desired. FIG. S is a schematic diagram of an active RF/IF input balun coupled to a differential inductively loaded cascode amplifier (transistors 206, 206', biased by capacitor 207; load inductors 208, 208). This circuit provides more power gain than the circuit versions with only inductive or resistive loading. Accordingly, other embodiments are within the scope of the following claims.

What is claimed is:

1. A circuit comprising a double balance differential active ring mixer with a current shared active input balun, the circuit being configured to be coupled to a bias circuit for providing a relatively constant current and a buffer circuit for receiving a signal from a local oscillator (LO) source and generating differential LO signals, the circuit including:

(a) an input node for receiving an input signal;

(b) the balun circuit including:

(1) a common gate amplifier having a source, a drain, and a gate, the source being coupled to the input node, the gate being DC coupled to be bias circuit and AC coupled, directly or indirectly, to ground, and the drain comprising a first output;

(2) a common source amplifier having a source, a drain, and a gate, the source being DC coupled to ground, the gate being coupled to the bias circuit and the input node, and the drain comprising a second output;

(3) an impedance coupled to the drain of the common source amplifier for compensating any difference in output or voltage gain between the common gate amplifier and the common source amplifier; and (c) the mixer being coupled to the first and second differential outputs and the differential LO signals, such that the mixer is adapted for generating differential intermediate frequency outputs.

2. The circuit of claim 1, wherein the input signal is a radio frequency signal.

3. The receiver circuit of claim 1, wherein the balun circuit couples to the bias circuit to receive the relatively constant current.

4. The receiver circuit of clam 1, wherein the balun circuit provides voltage gain to the input signal before the signal is output to the mixer through the first and second outputs.

5. The receiver circuit of claim 1, further including an RF bias choke inductor between the source of the common gate amplifier and ground.

6. The receiver circuit of claim 1, further including:

(a) a first shunt capacitor coupled between ground and the amplitude and phase balance compensation resistor;

(b) a first series inductor coupled to the first output between the balun circuit and the mixer, for providing a first impedance transformation from the balun to the mixer in order to maximize the voltage gain;

(c) a second shunt capacitor coupled to ground and to the second output; and (d) a second series inductor coupled to the second output between the balun circuit and the mixer, for providing a second impedance transformation from the balun to the mixer in order to maximize the voltage gain.

7. The receiver circuit of claim 1, further including a bypass capacitor coupled between the gate of the common gate amplifier and ground.

8. The receiver circuit of claim 1, further including a decoupling capacitor coupled between the gate of the common source amplifier and the input node.

9. An active balun circuit for transforming a radio frequency (RF) signal from an unbalanced signal into a pair of 180 degree part differential signals the circuit including:

(a) a common gate amplifier having a source, a drain, and a gate, the source configured to receive an RF signal, the gate configured to be coupled to a bias circuit, and the drain comprising a first output;

(b) a common source amplifier having a source, a drain and a gate, the source being coupled to ground, the gate configured to be coupled to the bias circuit and to receive the RF signal, and the drain comprising a second output; and (c) an amplitude and phase balance impedance coupled between the first output and ground for compensating any difference in output impedance and voltage gain between the first output and the second output.

10. The active balun circuit of claim 9, wherein the active balun circuit provides the voltage gain to the RF signal before output through the first and second outputs.

11. The active balun circuit of claim 10, further including an RF bias choke inductor coupled between the source of the common gate amplifier and ground.

12. The active balun circuit of claim 9, further including:

(a) a resistor and a first shunt capacitor coupled in series to ground and to the first output, the resistor and the first shunt capacitor forming the amplitude and phase balance impedance;

(b) a first series inductor coupled to the first output, for providing a first output impedance in order to maximize the voltage gain;

(c) a second shunt capacitor coupled to ground and to the second output; and (d) a second series inductor coupled to the second output, for providing a second output impedance from the balun to the coupled device.

13. The active balun circuit of claim 9, further including a bypass capacitor coupled between the gate of the common gate amplifier and ground.

14. The active balun circuit of claim 9, further including a decoupling capacitor coupled between the gate of the common source amplifier and the input node.

15. A balun circuit comprising:
a first amplifier having a first input, a first output, with a first output impedance, and a first voltage gain;
a second amplifier the second amplifier having a second input coupled to the first input, a second output impedance, a second voltage gain, and a second output; and
wherein an impedance is coupled to the first output of the first amplifier for amplitude and phase compensation of any difference between the first and second output impedance or the first and second voltage gain.

16. The balun circuit of claim 15 wherein the first amplifier is a common gate amplifier.

17. The balun circuit of claim 15 wherein the second amplifier is a common source amplifier.

18. The balun circuit of claim 15, further including an RF bias choke inductor between the source of the first amplifier and ground.

19. The balun circuit of claim 15, further including a bypass capacitor coupled between the gate of the first amplifier and ground.

20. The receiver circuit of claim 15, further including a decoupling capacitor coupled between the gate of the first amplifier and the first input.

21. The balun circuit of claim 15, further comprising a second impedance coupled to the second output of the second amplifier for amplitude and phase compensation of any difference between the first and second output impedance or the first and second voltage gain.

22. The balun circuit of claim 21 wherein the impedance and the second impedance each further comprise an active load.

23. The balun circuit of claim 21 wherein the impedance and the second impedance each further comprise a resistive load.

24. The balun circuit of claim 21 wherein the impedance and the second impedance each further comprise an inductive load.

25. The balun circuit of claim 15 wherein a radio frequency signal is received at the first input.

* * * * *